United States Patent [19]

Nakamura

[11] Patent Number: 5,827,772
[45] Date of Patent: Oct. 27, 1998

[54] FABRICATION PROCESS FOR THIN FILM TRANSISTOR

[75] Inventor: Kenichi Nakamura, Tokyo, Japan

[73] Assignee: NEC Corporation, Tokyo, Japan

[21] Appl. No.: 748,822

[22] Filed: Nov. 14, 1996

[30] Foreign Application Priority Data

Nov. 15, 1995 [JP] Japan ................................. 7-296549

[51] Int. Cl.$^6$ ........................................ H01L 21/20
[52] U.S. Cl. ............................... 438/486; 438/487
[58] Field of Search ................................ 438/164, 166, 438/486, 487; 117/7, 8; 148/DIG. 3

[56] References Cited

U.S. PATENT DOCUMENTS

| 5,403,762 | 4/1995 | Takemura | 438/164 |
| 5,470,763 | 11/1995 | Hamada | 438/162 |
| 5,508,207 | 4/1996 | Horai | 438/477 |
| 5,663,077 | 9/1997 | Adachi | 438/151 |

OTHER PUBLICATIONS

Y. Fukushima et al., "A Poly–Si TFT Process for High Speed and Low Voltage CMOS Circuits", *Ext'd Abs of the 1993 Int'l Conference on Solid State Devices and Materials*, Makuhari, 1993, pp. 993–995.

*Primary Examiner*—John Niebling
*Assistant Examiner*—Michael S. Lebentritt
*Attorney, Agent, or Firm*—Sughrue, Mion, Zinn, Macpeak & Seas, PLLC

[57] ABSTRACT

A thin film transistor has an active layer of a polycrystalline silicon. The crystallizing ability of polycrystalline silicon layer is improved by oxygen annealing. Oxygen concentration increased by oxygen annealing can be reduced by annealing under hydrogen atmosphere for providing increased carrier mobility for good high frequency characteristics.

30 Claims, 5 Drawing Sheets

FABRICATION PROCESS FOR THIN FILM TRANSISTOR

BACKGROUND OF THE INVENTION

1. Field of the Invention

The present invention relates generally to a fabrication process for a thin film transistor (TFT). More specifically, the invention relates to a fabrication process for an active layer formed of a semiconductor.

2. Description of the Prior Art

A thin film transistor having a polycrystalline silicon as an active layer (hereinafter referred to as p-TFT) has a higher mobility in comparison with a thin film transistor having amorphous silicon as active layer (hereinafter referred to as a-TFT). The p-TFT can is expected to be used for a driver circuit integrated type liquid crystal display element, contact image sensor and so forth. Thus, such p-TFT's have been actively studied and developed. One as application of the p-TFT, is a light bulb for a liquid crystal projector. Currently, there has been strong demand for higher performance of the liquid crystal projector for multimedia applications. For providing higher performance to the device, it is inherently necessary to have higher performance from the p-TFT. As a process therefor, there has been reported a solid phase epitaxy, excimer laser annealing method, high temperature process similar to LSI and so forth. Also, in recent years, as a method for providing higher performance for the p-TFT by the high temperature process, there has been proposed an oxygen annealing process which is attracting attention (SSDM '93, pp. 993–995).

The fabrication process of p-TFT by the oxygen annealing method will be discussed with reference to FIGS. 1A to 1E. Here, discussion will be given of the fabrication process for n-channel p-TFT. At first, as shown in FIG. 1A, after deposition of amorphous silicon (a-Si) layer 302 in a thickness of 120 nm on a quartz substrate 301 by LPCVD method, annealing is performed at 600° C. under nitrogen atmosphere for 20 hours for crystallization to form a polycrystalline silicon (p-Si) layer 303. Next, under dry oxygen atmosphere, annealing is performed at 1100° C. to form a thermal oxide layer 304 in a thickness of 44 nm, as shown in FIG. 1B. Next, as shown in FIG. 1C, the thermal oxide layer 304 is removed by utilizing 3% hydrofluoric acid. At this time, the thickness of the p-Si layer 303 is reduced into 100 nm. Then, by effecting patterning for the p-Si layer 303, an active layer 306 is formed. Then, a gate insulation layer 307 is deposited thereon.

Next, as shown in FIG. 1D, a gate electrode 308 is formed on the gate insulation layer 307. Subsequently, a high concentration phosphorous is implanted by an ion implantation in the active layer 306 consisted of the p-Si layer to form a source and drain region 309 as shown in FIG. 1E. Furthermore, after formation of an interlayer insulation layer 310 consisted of $SiO_2$ layer by plasma CVD method, contact hole is formed, and then source and drain electrode 311 of aluminum is formed by sputtering method.

On the other hand, in the oxygen annealing method performed upon formation of the active layer 306 as set forth above, it has been known that a defect density in the p-Si layer 303 is reduced from $10^{19}$ ($cm^{-3}$) to $10^{17}$ ($cm^{-3}$). Therefore, while the mobility of carrier in the active layer when the oxygen annealing is not performed, is 50 [$cm^2$/Vs], the mobility is improved to 150 [$cm^2$/Vs] by performing oxygen annealing. The mechanism of defect reduction by the oxygen annealing method will be discussed with reference to FIG. 2. By performing annealing for p-Si layer 303 under oxygen atmosphere, the thermal oxide layer 304 is formed on the p-Si leyer 303. In the process where the thermal oxide layer 304 is formed, silicon atom 401 movable between grids is generated to terminate a dangling bond present in a crystalline interface 303. Thus, defect density is reduced.

As set forth above, by oxygen annealing method, the mobility of carrier in the p-TFT can be improved to achieve 150 [$cm^2$/Vs]. Then, a driver circuit may operate at 30 MHz. However, in order to adapt the p-TFT to a high definition television receiver (HDTV), it becomes necessary to achieve capability of operation at 50 MHz. Therefore, a mobility of carrier in the p-TFT higher than or equal to 200 [$cm^2$/Vs] becomes necessary. As set forth above, by oxygen annealing, defect density in the p-Si layer can be reduced and thus improvement of mobility can be realized. However, as shown in FIG. 2, during oxygen annealing, oxygen atom 403 may penetrate into the p-Si layer 303 simultaneously with reduction of the defect density, to increase oxygen concentration to be higher than or equal to $10^{20}$ [$cm^{-3}$]. Such high oxygen concentration may cause scattering of carrier because oxygen in the layer 303 restricts mobility. Accordingly, further improvement of the mobility, necessary for HDTV receivers and so forth, is difficult.

SUMMARY OF THE INVENTION

Therefore, it is an object of the present invention to provide a fabrication process for TFT which is applicable for a high definition television receiver or so forth.

According to one aspect of the invention, a fabrication process of a thin film transistor comprises the steps of:

forming a semiconductor layer on an insulative substrate;

forming an active layer by patterning the semiconductor layer in an island-shaped structure;

forming a gate insulation layer on the active layer;

forming a gate electrode on the gate insulation layer;

forming a source and drain region by implanting impurity ion in high concentration in a portion of the active layer;

performing oxygen annealing by heating the semiconductor layer forming the active layer under oxygen atmosphere; and performing annealing at a given temperature under hydrogen atmosphere.

According to another aspect of the invention, a fabrication process of a thin film transistor comprises the steps of:

forming a semiconductor layer on an insulative substrate;

forming an active layer by patterning said semiconductor layer in an island-shaped structure;

forming a gate insulation layer on said active layer;

performing first annealing by heating said semiconductor layer forming said active layer under oxygen atmosphere for forming a thermal oxide layer;

performing second annealing at a given temperature under hydrogen atmosphere;

forming a gate electrode on said gate insulation layer; and forming a source and drain region by implanting impurity ion in high concentration in a portion of said active layer.

The fabrication process may further comprise a step to be performed immediately after said step of performing first annealing and immediately before said step of performing second annealing, for removing said thermal oxide layer.

In the preferred construction, the semiconductor layer may be a polycrystalline silicon layer. Preferably, the step of forming the semiconductor layer may comprise:

a step of forming an amorphous silicon layer; and a step of forming a polycrystalline silicon layer by crystallizing the amorphous silicon.

The step of annealing is performed in a temperature range of 900° to 1200° C. under hydrogen atmosphere. On the other hand, the step of oxygen annealing is performed at a substrate temperature range of 250° to 350° C. under a plasma oxygen atmosphere, 600° to 900° C. under high pressure oxygen atmosphere, 800° to 1100° C. under wet oxygen atmosphere, and 900° to 1200° C. under dry oxygen atmosphere.

BRIEF DESCRIPTION OF THE DRAWINGS

The present invention will be understood more fully from the detailed description given hereinbelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The preferred embodiments of the present invention will be discussed hereinafter with reference to the accompanying drawings, particularly to FIGS. 3A to 5E. In the following description, numerous specific details are set forth as an example in order to provide a thorough understanding of the present invention. It will be obvious, however, to those skilled in the art that the present invention may be practiced without these specific details. Further, well-known structures are not shown in detail in order to avoid obscuring the present invention.

Figure 3A:
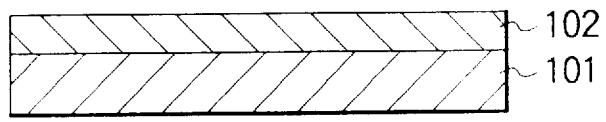
FIGS. 3A to 3E are sections showing process steps in the first embodiment of a fabrication process of p-TFT according to the present invention.
Figure 3B:
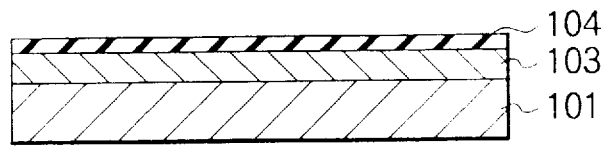
Figure 3C:
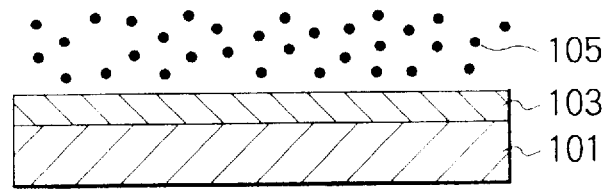

FIGS. 3A to 3E are sections showing process steps in the first embodiment of a fabrication process of n-channel p-TFT according to the present invention. At first, as shown in FIG. 3A, an a-SI layer 102 in a thickness of 120 nm is formed on a quartz substrate 101 by a LPCVD method. Subsequently, under nitrogen atmosphere, crystallization is performed by solid phase epitaxy at 600° C. for 20 hours to form a p-Si layer 103 as shown in FIG. 3B. Next, under dry oxygen atmosphere, annealing is performed at 1100° C. to form a thermal oxide layer 104 in a thickness of 44 nm. Subsequently, as shown in FIG. 3C, the thermal oxide layer 104 is removed by 3% hydrofluoric acid. At this time, the layer thickness of the p-Si layer 103 is reduced to be 100 nm. Here, defect density in the p-Si layer is reduced from $10^{19}$ [cm$^{-3}$] to $10^{17}$ [cm$^{-3}$], and oxygen concentration becomes $10^{20}$ [cm$^{-3}$]. Subsequently, annealing is performed under hydrogen atmosphere at 1000° C. for one hour. At this time, the oxygen concentration in the p-Si layer 103 is reduced from $10^{20}$ [cm$^{-3}$] to $10^{17}$ [cm$^{-3}$].

Figure 3D:
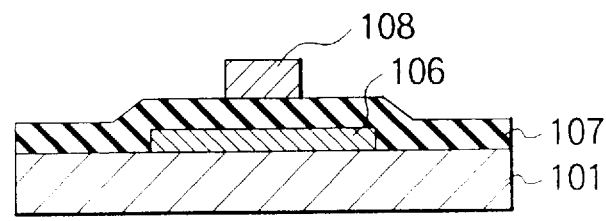
Figure 3E:
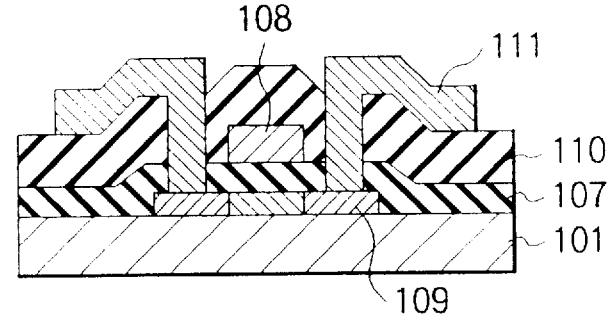

Thereafter, as shown in FIG. 3D, the p-Si layer 103 is patterned to form an active layer 106. A gate insulation layer 107 of SiO$_2$ layer in the thickness of 100 nm is formed over the active layer, 106 by the LPCVD method. Also, a gate electrode 108 of a p-Si layer containing high concentration phosphorous is formed on the gate insulation layer 107. Then, as shown in FIG. 3E, high concentration phosphorous is introduced into the active layer 106 by ion implantation to form source and drain regions 109. Furthermore, after formation of an interlayer insulation layer 110 of SiO$_2$ layer by way of plasma CVD method, contact holes are formed. Then, aluminum is deposited by sputtering to form source and drain electrodes 111.

Here, in the first embodiment as set forth above, upon formation of the active layer, the defect density in the p-Si layer 103 is reduced by effecting oxygen annealing for the p-Si layer 103. This is the same as the prior art. Following the process step of oxygen annealing, hydrogen annealing is performed to reduce oxygen concentration which can be a factor causing scattering of carrier in the active layer.

Figure 4A:
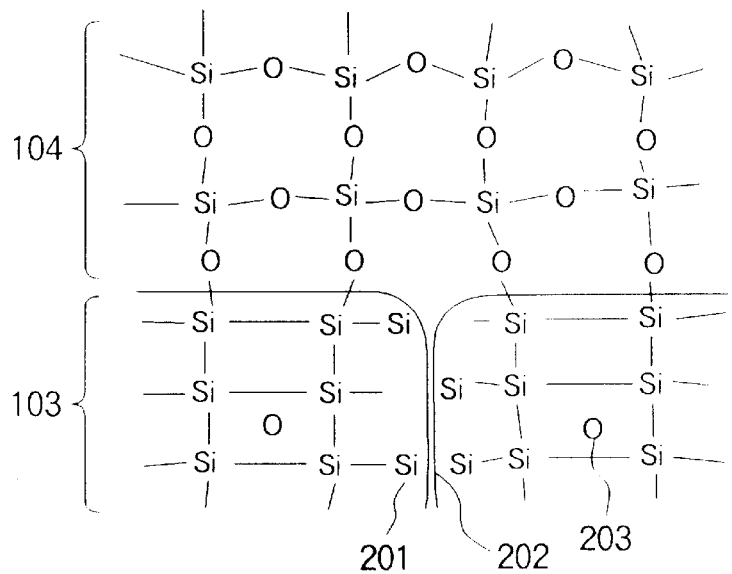
FIGS. 4A to 4C are diagrammatic illustration for explaining behavior caused in crystal structure during oxygen annealing.
Figure 4B:
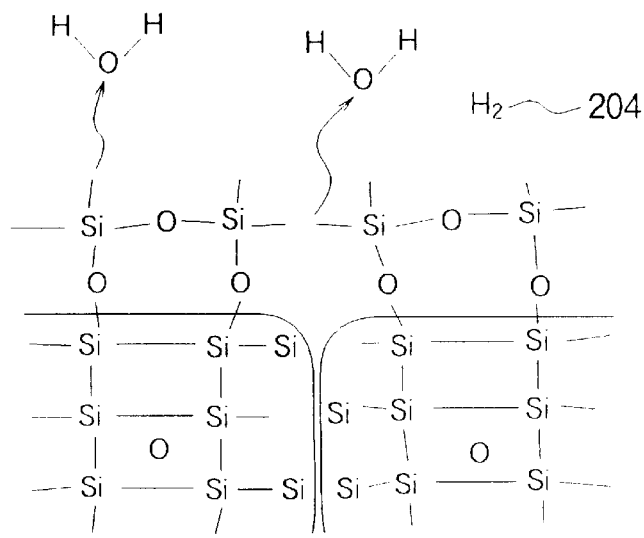
Figure 4C:
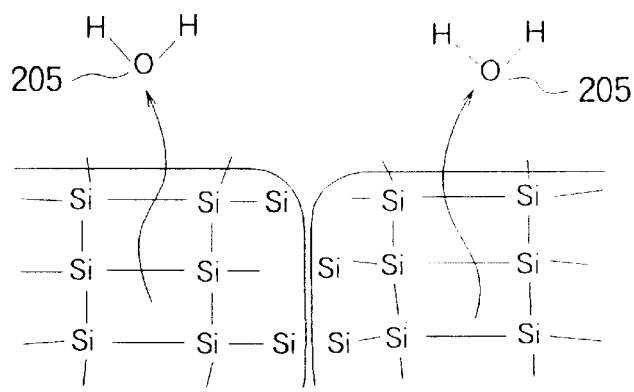

A mechanism by which reduction of oxygen concentration in the p-Si layer by hydrogen annealing occurs is considered to be as follows. At first, as shown in FIG. 4A, oxygen annealing forms a thick natural oxide layer 104 on the surface of the p-Si layer 103. In the p-Si layer 103, crystalline interface 202 is present because silicon atom 201 terminates in a dangling bond and oxygen penetrates within the crystal grain. In the initial stage of hydrogen annealing, natural oxide layer 104 is removed by a hydrogen reduction. By further performing hydrogen annealing, oxygen concentration on the surface becomes a balanced oxygen concentration under hydrogen atmosphere to externally diffuse oxygen. As set forth above, the oxygen concentration on the surface is reduced. Oxygen in the layer diffuses to the surface and is gradually reduced as time goes on.

Incidentally, in the shown embodiment, since hydrogen annealing is performed after removal of thermal oxide layer, the carrier mobility of the produced n-channel p-TFT could be improved to achieve 250 [cm$^2$/Vs]. By improvement of mobility, it becomes possible to operate the driver circuit at higher than or equal to 50 MHz to realize higher performance of the device and thus to permit its use in high definition television receives or so forth.

Figure 5A:
FIGS. 5A to 5E are sections showing process steps in the second embodiment of a fabrication process of p-TFT according to the present invention.
Figure 5B:
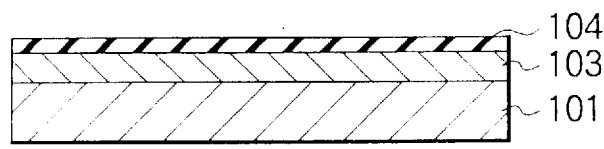

Next, the second embodiment of fabrication process of n-channel p-TFT according to the present invention will be discussed with reference to FIGS. 5A to 5E. At first, as shown in FIG. 5A, an a-SI layer 102 in a thickness of 120 nm is formed on a quartz substrate 101 by a LPCVD method. Subsequently, under nitrogen atmosphere, crystallization is performed by solid phase epitaxy at 600° C. for 20 hours to form a p-Si layer 103 as shown in FIG. 5B. Next, under wet oxygen atmosphere, annealing is performed at 900° C. to form thermal oxide layer 104 in a thickness of 44 nm. At this time, the thickness of the p-Si layer is reduced to be 100 nm. Here, the defect density in the p-Si layer 103 is reduced from $10^{19}$ [cm$^{-3}$] to $10^{17}$ [cm$^{-3}$], and the oxygen concentration in the layer is $10^{20}$ [cm$^{-3}$].

Figure 1A:
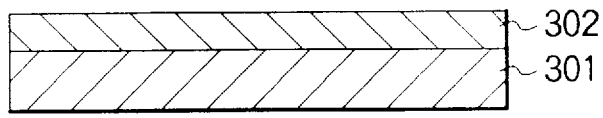
FIGS. 1A to 1E are sections showing process steps in one example of the conventional fabrication process of p-TFT.
Figure 1B:
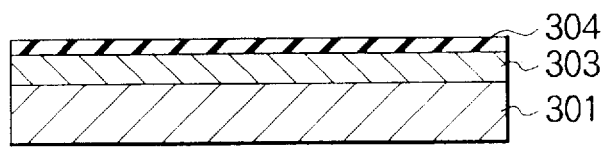
Figure 1C:
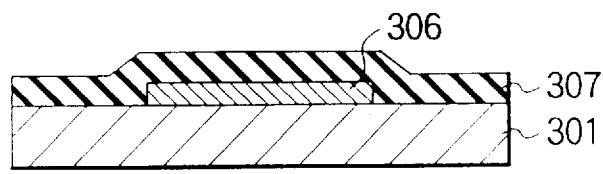
Figure 1D:
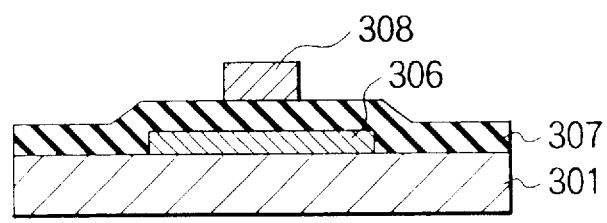
Figure 1E:
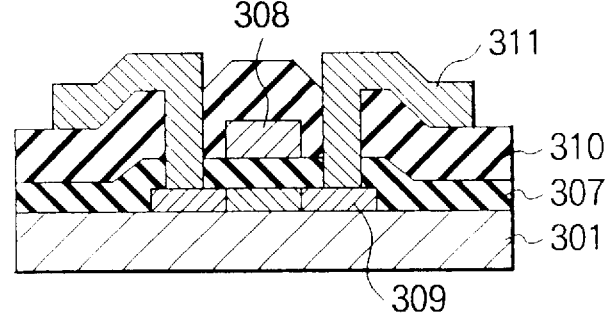
Figure 2:
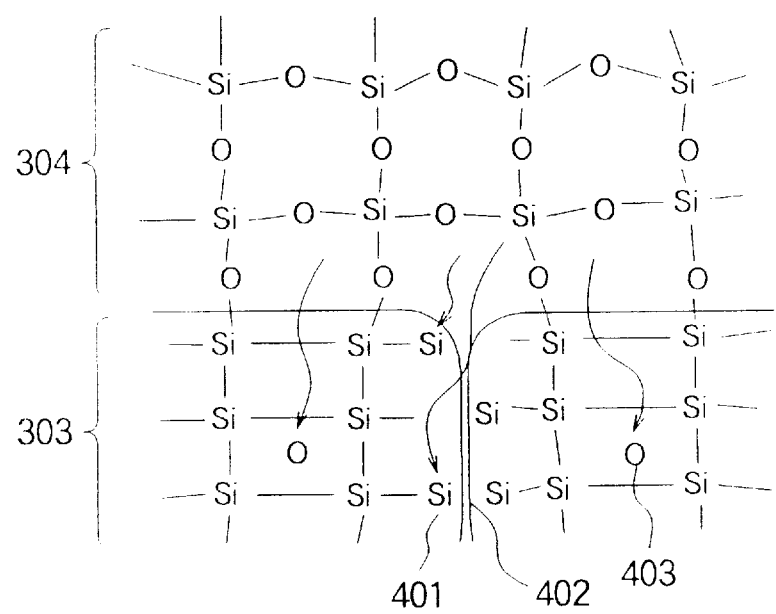
FIG. 2 is a diagrammatic illustration for explaining behavior caused in crystal structure during oxygen annealing.
Figure 5C:
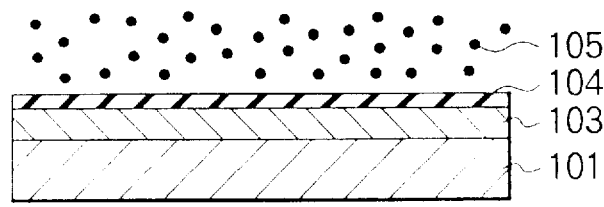
Figure 5D:
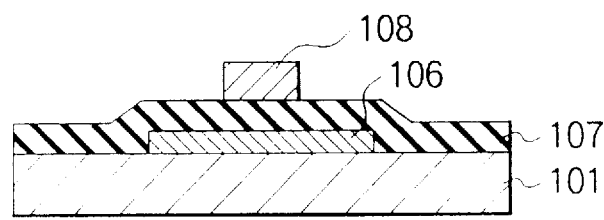
Figure 5E:
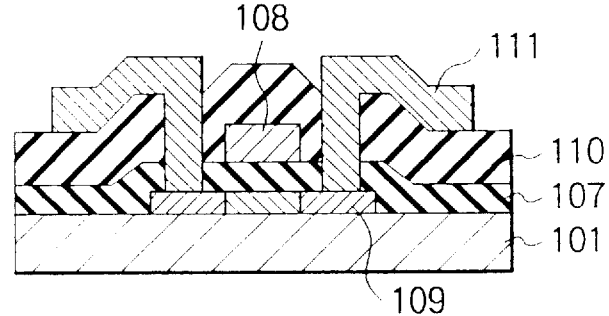

Next, as shown in FIG. 5C. without removing the thermal oxide layer 104, annealing is performed under hydrogen atmosphere 105 at 1100° C. for 30 minutes. At this time, the oxygen concentration in the layer is reduced from $10^{20}$ [cm$^{-3}$] to $10^{17}$ [cm$^{-3}$]. Thereafter, as shown in FIG. 5D, the p-Si layer 103 is patterned to form an active layer 106. A gate insulation layer 107 of SiO$_2$ layer in the thickness of 100 nm is formed over the active layer, 106 by the LPCVD method. Also, a gate electrode 108 of a p-Si layer containing high concentration phosphorous is formed on the gate insulation layer 107. Then, as shown in FIG. 1E, high concentration phosphorous is introduced into the active layer 106 by ion implantation to form a source and drain regions 109. Furthermore, after formation of an interlayer insulation layer 110 of $SiO_2$ layer by way of plasma CVD method, contact holes are formed. Then, aluminum is deposited by sputtering to form source and drain electrodes 111.

Even in the shown embodiment, defect density in the p-Si layer 103 can be reduced by effecting oxygen annealing. Also, by performing hydrogen annealing immediately after oxygen annealing, oxygen concentration can be reduced. On the other hand, in the shown embodiment, by performing hydrogen annealing without removing thermal oxide layer 104 formed through oxygen annealing, degradation of flatness of the p-Si layer 103 can be restricted even when hydrogen annealing is performed at high temperature. Furthermore, by performing hydrogen annealing without removing thermal oxide layer 104 at high temperature, hydrogen annealing can be done in a short time period thereby improving throughput or production capacity.

Incidentally, in the shown embodiment, since hydrogen annealing is performed without removing thermal oxide layer 104 at high temperature, the mobility of carrier of the produced n-channel p-TFT can be improved to achieve 300 [$cm^2/Vs$]. By improvement of mobility, the driver circuit can be operated at a frequency higher than or equal to 50 MHz. Therefore, similarly to the foregoing first embodiment, it becomes possible to use the TFT for high definition television receivers or so forth, and higher performance of the device is realized.

Although the invention has been illustrated and described with respect to an exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which are encompassed within the scope of the appended claims and equivalents there to.

For example, it should be noted that, with respect to the first and second embodiments, fabrication process for n-channel p-TFT has been discussed. However, p-channel p-TFT and MOSFET of SOI structure may be fabricated.

On the other hand, in the first embodiment, the atmosphere of oxygen annealing is dry oxygen atmosphere, and in the second embodiment, the atmosphere of oxygen annealing is wet oxygen atmosphere. However, similar effect can be obtained even when oxygen annealing is performed in high pressure oxygen atmosphere or low temperature plasma oxygen atmosphere. It should be noted that the preferred range of the substrate temperature with respect to oxygen atmosphere is 900° to 1200° C. in dry oxygen atmosphere and 800° to 1100° C. in the wet oxygen atmosphere, 600° to 900° C. in the high pressure oxygen atmosphere and 250° to 350° C. in the low temperature plasma oxygen atmosphere. When the temperature is lower than the foregoing ranges, the annealing period becomes excessively long thus making the process impractical. Conversely, when the temperature is higher than the foregoing range, oxidation happens too fast to control the layer thickness which creates problems, such as roughening of the surface.

Furthermore, while the temperature during hydrogen annealing is set at 1100° C. in respective embodiments, similar effect may be obtained even if annealing is performed at a temperature lower than or equal to 900° C. However, at the temperature lower than or equal to 900° C., a diffusion coefficient of oxygen becomes small which causes lengthening of the hydrogen annealing period thus making it impractical. Also, while the similar effect may be obtained even by performing hydrogen annealing at a temperature about 1200° C., another problem of deflection or deformation of the substrate may be caused during hydrogen annealing at a temperature higher than 1200° C.

As set forth above, according to the present invention, after reducing defect density in the p-Si layer by oxygen annealing and improving crystallization ability, annealing is performed under hydrogen atmosphere to reduce oxygen concentration which otherwise would cause scattering of carrier. Therefore, scattering of carrier due to oxygen can be restricted thereby further improving carrier mobility in comparison with the case where only oxygen annealing is performed. Furthermore, high frequency characteristics of the thin film transistor can be enhanced and the thin film transistor becomes useful for high definition television receivers and so forth.

What is claimed is:

1. A fabrication process of a thin film transistor comprising the steps of:

forming a semiconductor layer on an insulative substrate;

forming an active layer by patterning said semiconductor layer in an island-shaped structure;

forming a gate insulation layer on said active layer;

forming a gate electrode on said gate insulation layer;

forming a source and drain region by implanting impurity ions in high concentration in a portion of said active layer;

performing oxygen annealing by heating said semiconductor layer under oxygen atmosphere, wherein said step of oxygen annealing is done between said step of forming a semiconductor layer and said step of forming an active layer; and performing hydrogen annealing at a temperature in the range of 900° to 1200° C. under hydrogen atmosphere, wherein said step of hydrogen annealing is done between said step of oxygen annealing and said step of forming an active layer.

2. A fabrication process of a thin film transistor as set forth in claim 1, wherein said semiconductor layer is a polycrystalline silicon layer.

3. A fabrication process of a thin film transistor as set forth in claim 2, wherein said step of forming said semiconductor layer comprises:

a step of forming amorphous silicon layer; and a step of forming a polycrystalline silicon layer by crystallizing said amorphous silicon.

4. A fabrication process of a thin film transistor as set forth in claim 1, wherein oxygen annealing is performed in a substrate temperature range of 250° to 350° C. under a plasma oxygen atmosphere.

5. A fabrication process of a thin film transistor as set forth in claim 1, wherein oxygen annealing is performed in a substrate temperature range of 600° to 900° C. under high pressure oxygen atmosphere.

6. A fabrication process of a thin film transistor as set forth in claim 1, wherein oxygen annealing is performed in a substrate temperature range of 800° to 1100° C. under wet oxygen atmosphere.

7. A fabrication process of a thin film transistor as set forth in claim 1, wherein oxygen annealing is performed in a substrate temperature range of 900° to 1200° C. under dry oxygen atmosphere.

8. A fabrication process of a thin film transistor comprising the steps of:

forming a semiconductor layer on an insulative substrate;

forming an active layer by patterning said semiconductor layer;

performing first annealing by heating said semiconductor layer under oxygen atmosphere thereby forming a thermal oxide layer;

performing second annealing at a temperature in the range of 900° to 1200° C. under hydrogen atmosphere; and forming a source and drain region by implanting impurity ions in high concentration in a portion of said active layer, wherein said step of forming a source and drain region is subsequent to said second annealing step.

9. A fabrication process of a thin film transistor as set forth in claim 8, which further comprises a step to be performed immediately after said step of performing first annealing and immediately before said step of performing second annealing, for removing said thermal oxide layer.

10. A fabrication process of a thin film transistor as set forth in claim 8, wherein said semiconductor layer is a polycrystalline silicon layer.

11. A fabrication process of a thin film transistor as set forth in claim 8, wherein said step of forming said semiconductor layer comprises:

a step of forming amorphous silicon layer; and a step of forming a polycrystalline silicon layer by crystallizing said amorphous silicon.

12. A fabrication process of a thin film transistor as set forth in claim 8, wherein oxygen annealing is performed in a substrate temperature range of 900° to 1200° C. under dry oxygen atmosphere.

13. A fabrication process of a thin film transistor as set forth in claim 8, wherein oxygen annealing is performed in a substrate temperature range of 250° to 350° C. under a plasma oxygen atmosphere.

14. A fabrication process of a thin film transistor as set forth in claim 8, wherein oxygen annealing is performed in a substrate temperature range of 600° to 900° C. under high pressure oxygen atmosphere.

15. A fabrication process of a thin film transistor as set forth in claim 8, wherein oxygen annealing is performed in a substrate temperature range of 800° to 1100° C. under wet oxygen atmosphere.

16. A fabrication process of a thin film transistor as set forth in claim 8, further comprising a step of forming a gate insulation layer on said active layer.

17. A fabrication process of a thin film transistor as set forth in claim 16, further comprising the step of forming a gate electrode on said gate insulation layer.

18. A process of fabricating a thin film transistor comprising, in order, the steps of:

(a) forming a semiconductor layer on an insulative substrate;

(b) performing hydrogen annealing at a temperature in the range of 900° to 1200° C. under hydrogen atmosphere; and (c) forming an active layer by patterning said semiconductor layer.

19. A process of fabricating a thin film transistor as set forth in claim 18, further comprising, between steps (a) and (b), the step of performing oxygen annealing by heating said semiconductor layer under oxygen atmosphere thereby forming a thermal oxide layer.

20. A process of fabricating a thin film transistor as set forth in claim 19, wherein said oxygen annealing step is performed in a substrate temperature range of 900° to 1200° C. under dry oxygen atmosphere.

21. A process of fabricating a thin film transistor as set forth in claim 19, wherein said oxygen annealing step is performed in a substrate temperature range of 250° to 350° C. under plasma oxygen atmosphere.

22. A process of fabricating a thin film transistor as set forth in claim 19, wherein said oxygen annealing step is performed in a substrate temperature range of 600° to 900 C. under high pressure oxygen atmosphere.

23. A process of fabricating a thin film transistor as set forth in claim 19, wherein said oxygen annealing step is performed in a substrate temperature range of 800° to 1100° C. under wet oxygen atmosphere.

24. A process of fabricating a thin film transistor as set forth in claim 19, further comprising, before said oxygen annealing step, the step of performing a crystallization of said semiconductor layer under nitrogen atmosphere.

25. A process of fabricating a thin film transistor as set forth in claim 24, further comprising, between said oxygen annealing step and said hydrogen annealing step, the step of removing said thermal oxide layer.

26. A process of fabricating a thin film transistor comprising, in order, the steps of:

(a) forming a semiconductor layer on an insulative substrate;

(b) performing a crystallization of said semiconductor layer under nitrogen atmosphere;

(c) performing hydrogen annealing at a given temperature under hydrogen atmosphere; and (d) forming an active layer by patterning said semiconductor layer.

27. A process of fabricating a thin film transistor as set forth in claim 26, wherein said step of hydrogen annealing is performed at a temperature in the range of 900° to 1200° C.

28. A process of fabricating a thin film transistor as set forth in claim 26, further comprising, between steps (b) and (c), the step of performing oxygen annealing by heating said semiconducting layer under oxygen atmosphere.

29. A process of fabricating a thin film transistor comprising, in order, the steps of:

(a) forming a semiconductor layer on an insulative substrate;

(b) performing oxygen annealing by heating said semiconductor layer under oxygen atmosphere to form a thermal oxide layer;

(c) removing said thermal oxide layer;

(d) performing hydrogen annealing at a given temperature under hydrogen atmosphere; and (e) forming an active layer by patterning said semiconductor layer.

30. A process of fabricating a thin film transistor as set forth in claim 29, wherein step (d) is performed at a temperature in the range of 900° to 1200° C.

* * * * *